United States Patent
Zhang et al.

(10) Patent No.: US 10,388,818 B2
(45) Date of Patent: Aug. 20, 2019

(54) SEMICONDUCTOR DETECTOR

(71) Applicant: NUCTECH COMPANY LIMITED, Beijing (CN)

(72) Inventors: Lan Zhang, Beijing (CN); Yingshuai Du, Beijing (CN); Bo Li, Beijing (CN); Zonggui Wu, Beijing (CN); Jun Li, Beijing (CN); Xuepeng Cao, Beijing (CN); Haifan Hu, Beijing (CN); Jianping Gu, Beijing (CN); Guangming Xu, Beijing (CN); Bicheng Liu, Beijing (CN)

(73) Assignee: NUCTECH COMPANY LIMITED, Beijing (CN)

(*) Notice: Subject to any disclaimer, the term of this patent is extended or adjusted under 35 U.S.C. 154(b) by 0 days.

(21) Appl. No.: 15/625,473

(22) Filed: Jun. 16, 2017

(65) Prior Publication Data

US 2018/0062021 A1    Mar. 1, 2018

(30) Foreign Application Priority Data

Aug. 31, 2016    (CN) .......................... 2016 1 0797815

(51) Int. Cl.
*H01L 31/118* (2006.01)
*G01T 1/24* (2006.01)
*G01T 1/02* (2006.01)
*H01L 27/144* (2006.01)
*H01L 31/0224* (2006.01)
*H01L 31/028* (2006.01)
(Continued)

(52) U.S. Cl.
CPC ............ *H01L 31/118* (2013.01); *G01T 1/026* (2013.01); *G01T 1/241* (2013.01);
(Continued)

(58) Field of Classification Search
CPC ......... H01L 31/0224; H01L 31/022416; H01L 31/115–119; G01T 1/241; G01T 1/244; G01T 1/24–249
See application file for complete search history.

(56) References Cited

U.S. PATENT DOCUMENTS 6,002,134 A    12/1999   Lingren
6,034,373 A *  3/2000   Shahar .............. H01L 27/14676
                                                      250/338.4
(Continued)

FOREIGN PATENT DOCUMENTS

WO    WO 2009/134629 A2    11/2009
WO    WO 2013/088352 A2    6/2013

OTHER PUBLICATIONS

European Patent Application No. 17176445.9; Extended Search Report; dated Nov. 21, 2017; 8 pages.

*Primary Examiner* — Bryan R Junge
(74) *Attorney, Agent, or Firm* — BakerHostetler

(57) ABSTRACT

There is provided a semiconductor detector. According to an embodiment, the semiconductor detector may include a semiconductor detection material including a first side and a second side opposite to each other. One of the first side and the second side is a ray incident side that receives incident rays. The detector may further include a plurality of pixel cathodes disposed on the first side and a plurality of pixel anodes disposed on the second side. The pixel anodes and the pixel cathodes correspond to each other one by one. The detector may further include a barrier electrode disposed on a periphery of respective one of the pixel cathodes or pixel anodes on the ray incident side. According to the embodiment of the present disclosure, it is possible to effectively suppress charge sharing between the pixels and thus to improve an imaging resolution of the detector.

12 Claims, 4 Drawing Sheets

(51) Int. Cl.
*H01L 31/0296* (2006.01)
*H01L 31/0304* (2006.01)
*H01L 31/032* (2006.01)

(52) U.S. Cl.
CPC ........ *H01L 27/1446* (2013.01); *H01L 31/028* (2013.01); *H01L 31/0296* (2013.01); *H01L 31/02966* (2013.01); *H01L 31/022408* (2013.01); *H01L 31/022416* (2013.01); *H01L 31/032* (2013.01); *H01L 31/0304* (2013.01)

(56) References Cited

U.S. PATENT DOCUMENTS

| | | | | |
|---|---|---|---|---|
| 2002/0036269 A1* | 3/2002 | Shahar | ................ | G01T 1/2928 250/370.1 |
| 2006/0118730 A1* | 6/2006 | Hefetz | ................ | G01T 1/2928 250/370.09 |
| 2008/0173822 A1* | 7/2008 | Feltgen | ................ | H01L 31/085 250/370.01 |
| 2008/0175347 A1* | 7/2008 | Tkaczyk | ................ | G01T 1/249 378/7 |
| 2008/0203514 A1* | 8/2008 | Szeles | ................ | H01L 27/14658 257/442 |
| 2009/0224167 A1* | 9/2009 | Blevis | ................ | G01T 1/241 250/370.13 |
| 2011/0135068 A1* | 6/2011 | Decker | ................ | G01T 1/24 378/147 |
| 2011/0155918 A1* | 6/2011 | Bouhnik | ................ | G01T 1/249 250/370.14 |
| 2014/0319363 A1* | 10/2014 | Engel | ................ | G01T 1/241 250/370.01 |
| 2014/0341333 A1* | 11/2014 | Wang | ................ | A61B 6/032 378/19 |
| 2017/0322319 A1* | 11/2017 | Iniewski | ................ | G01T 1/17 |

* cited by examiner

SEMICONDUCTOR DETECTOR

CROSS-REFERENCE TO RELATED APPLICATION

This application claims benefit of Chinese Patent Application No. 201610797815.6 filed on Aug. 31, 2016 in the State Intellectual Property Office of China, the disclosure of which is incorporated herein by reference.

TECHNICAL FIELD

The present disclosure relates to semiconductor detectors for radiation detection, and more particularly to electrode design in a direction of an incident ray of a detector for radiation detection and imaging.

BACKGROUND

Semiconductor detectors, due to their higher detection efficiency and better energy resolution, are widely concerned, and applied to various applications of the radiation detection, for example, nuclide identification devices, alarming radiation dosimeter, etc. in environmental radiation detection; item detection devices, such as item inspection machines and industrial computer tomography (CT), in national security; CT, dental imaging, positron emission tomography (PET), single photon computer tomography (SPECT), etc. in medical applications. There are many types of semiconductor materials, such as CdMnTe (cadmium manganese telluride), $HgI_2$ (Mercuric iodide), TlBr (Thallium bromide), $PbI_2$ (Lead iodide), GaAs (Gallium arsenide), Ge (germanium), and so on, which are applied to different areas due to their different characteristics.

CdZnTe (cadmium zinc telluride, abbreviated to CZT), in addition to its good energy resolution and high detection efficiency, can work at the room temperature, which enables it to be the most promising material for radiation detection. With the CZT semiconductor, detectors designed in a pixel-based structure can be applied in a number of areas of radiation imaging, such as dental CT, SPECT and so on.

The pixel-based structure can obtain not only a good energy resolution but also a relatively high spatial resolution, and thus has wide application prospects in astronomical imaging, medical imaging, and other aspects.

A pixel electrode (pixel cathode or pixel anode) is a unipolar charge sensitive technique, with induced charges contributed by drifting of only one type of carriers. Unlike a uniform electric field in a planar detector, a pixel-based detector has a non-uniform electric field distribution therein. A generated free charge, when drifting in a region distant to pixel electrodes, induces very small charge on a single pixel electrode, because the free charge is shared by a plurality of pixel electrodes. Only when the free charge drifts near the pixel electrode, the induced charge on the corresponding pixel electrode will change rapidly. The induced charge on the single pixel electrode is almost entirely contributed by drifting of the charge in the vicinity of the pixel electrode. In the CZT detector with pixel anodes, the induced charges on the pixel anodes contributed by hole drifting are almost negligible, thus realizing the unipolar charge sensitivity technique and improving the energy spectrum resolution.

However, free charges will diffuse during drifting, and some of the charges will be collected by adjacent pixels, resulting in charge distribution problems. With the decrease in pixel size, the problem of charge distribution becomes more severe, making the energy spectrum resolution of one single pixel worse. For example, when a position at which a photon is incident is in the middle of two adjacent pixels, then charges induced by the incident photon will be collected by those two adjacent pixels, resulting in false signals in each of those two pixels. For another example, when a position at which a photon is incident is in the middle of four adjacent pixels, then charges induced by the incident photon will be collected by those four adjacent pixels. In actual situations, the position of the incident photon is uncertain, and a signal component contributed by respective pixels is also uncertain, so it is difficult to determine the accurate position of a ray.

Charge sharing may be corrected through signal compliance, but workload in circuit design is very large, and the efficiency of signal correction will not be very high. It is impossible to achieve real-time signal acquisition and analysis by data collection and then data processing.

SUMMARY

In view of the above problems, the present disclosure aims to provide, among others, a semiconductor detector having an improved electrode structure in a direction of an incident ray.

According to an aspect of the present disclosure, there is provided a semiconductor detector comprising: a semiconductor detection material including a first side and a second side opposite to each other, wherein one of the first side and the second side is a ray accident side that receives incident rays; a plurality of pixel cathodes disposed on the first side; a plurality of pixel anodes disposed on the second side, wherein the pixel anodes and the pixel cathodes correspond to each other one by one; and a barrier electrode disposed on a periphery of respective one of the pixel cathodes and pixel anodes on the ray incident side.

For example, the ray incident side may be the first side. In this case, the barrier electrode may be disposed on the periphery of the respective one of the pixel cathodes and aligned with the gap between corresponding ones of the pixel anodes. Alternatively, the ray incident side may be the second side. In this case, the barrier electrode may be disposed on the periphery of the respective one of the pixel anodes and aligned with the gap between corresponding ones of the pixel cathodes.

The rays may comprise a variety of suitable rays, including, for example, at least one of X-rays, gamma rays, isotope rays, or alpha rays.

The pixel anode or pixel cathode may be in various suitable shapes, such as a square, rectangular, circular or rhombus shape.

The barrier electrode may define a space in a square, rectangular, circular or rhombic shape, and the corresponding pixel cathode or pixel anode on the ray incident side may be provided in the space.

The semiconductor detection material may comprise various suitable ray detection materials, including, for example, CdZnTe, Ge, CdTe, $HgI_2$, $PbI_2$, TiBr or GaAs.

The pixel anode and the pixel cathode each may comprise various suitable electrode materials, including, for example, at least one of gold, platinum, nickel, titanium or indium.

The barrier electrode may comprise a metal material with a high atomic number, for example, at least one of lead, iron, tungsten, copper, gold, platinum, or indium.

The semiconductor detector according to the present disclosure may further comprise an insulating material filled between the barrier electrode and the pixel cathode or the pixel anode on the ray incident side.

In the semiconductor detector according to the present disclosure, the pixel anodes or the pixel cathodes may be arranged in a one-dimensional linear array or a two-dimensional planar array.

The semiconductor detector according to the present disclosure may also include a bonding wire or a PCB circuit board package for applying bias voltages to the barrier electrode and the pixel anode or the pixel cathode on the ray incident side.

According to embodiments of the present disclosure, the barrier electrode may be incorporated to the ray incident side. The barrier electrode can block a radiation signal between pixels of the detector so that the rays entering the detector are incident on the pixels, so as to suppress charge sharing between the pixels, improve an imaging resolution of the detector, and reduce the influence of the shared signal on the detector performance.

BRIEF DESCRIPTION OF THE DRAWINGS

The foregoing and other objects, features and advantages of the present disclosure will become more apparent from the following description of embodiments of the present disclosure with reference to the accompanying drawings, in which.

DETAILED DESCRIPTION

Figure 1:
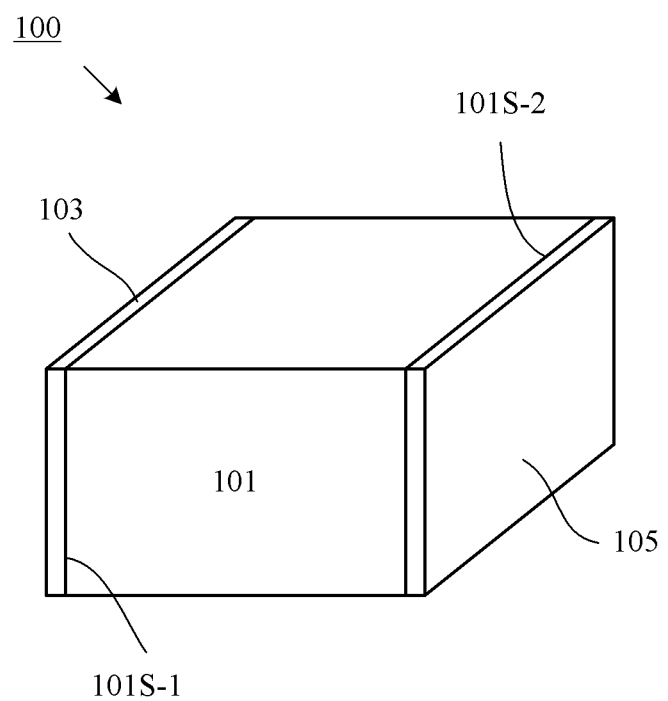
FIG. 1 is a perspective view showing a semiconductor detector according to an embodiment of the present disclosure.

Hereinafter, embodiments of the present disclosure are described with reference to the attached drawings. However, it is to be noted that those descriptions are just provided for illustrative purpose, rather than limiting the present disclosure. Further, in the following, descriptions of known structures and techniques are omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

FIG. 1 is a perspective view showing a semiconductor detector according to an embodiment of the present disclosure.

As shown in FIG. 1, the semiconductor detector 100 according to this embodiment may include a semiconductor detection material 101. Here, the semiconductor detection material 101 is capable of interacting with radiation to be detected and thus generating electric charges. For example, the semiconductor detection material 101 may include CdZnTe, Ge, CdTe, $HgI_2$, $PbI_2$, TlBr or GaAs. In the following description, CdZnTe (CZT) is described as an example, but the present disclosure is not limited thereto. The semiconductor detection material 101 may be a crystalline material, so that at least some of its surfaces can be obtained, for example, by cleavage. In this example, the semiconductor detection material 101 is shown as a hexahedron (more specifically, a rectangular solid) having a size of about 10 mm×10 mm×5 mm. However, the present disclosure is not limited thereto.

The semiconductor detection material 101 may include opposite sides 101S-1 and 101S-2, on which a cathode 103 and an anode 105 may be formed, respectively. An electric field may be formed between the cathode 103 and the anode 105 to direct the charges induced by the radiation in the semiconductor detection material 101 in order to detect the radiation. In the following description, it is described as an example that the side surface 101S-1 is a side on which radiation rays are incident. The rays may include at least one of, for example, X-rays, gamma rays, isotope rays, or alpha rays. In this case, the radiation may be incident on the semiconductor detection material 101 via the cathode 103, interacting with the semiconductor detection material 101, and thus generating the electric charges (e.g., electrons). The charges may be collected by the anode 105, and thereby a detection signal may be obtained as a result of the detection by the detector. Certainly, the present disclosure is not limited thereto. For example, the rays may be incident from the side 101S-2. In this case, the cathode and the anode can be interchangeable in the following description.

The cathode 103 and the anode 105 may each include, for example, a conductive material, for example, a metal material such as one of gold, platinum, nickel, titanium, or indium, or a mixture thereof, or a laminate thereof. The cathode 103 and the anode 105 may be formed by, for example, vaporizing the conductive material onto the sides 101S-1 and 101S-2 of the semiconductor detection material 101, respectively, and performing photolithography on the vapor-deposited conductive material. It is to be noted that the cathode 103 and the anode 105 may include the same material or different materials.

The cathode 103 and the anode 105 may be formed in various forms. Here, the pixel type electrode is described as an example. Specifically, the cathode 103 may be formed as a pixel array formed on the side 101S-1, and the anode 105 may be formed as a pixel array on the side 101S-2. The array can be a one-dimensional linear array or two-dimensional planar array. This will be described in further detail below.

Figure 2A:
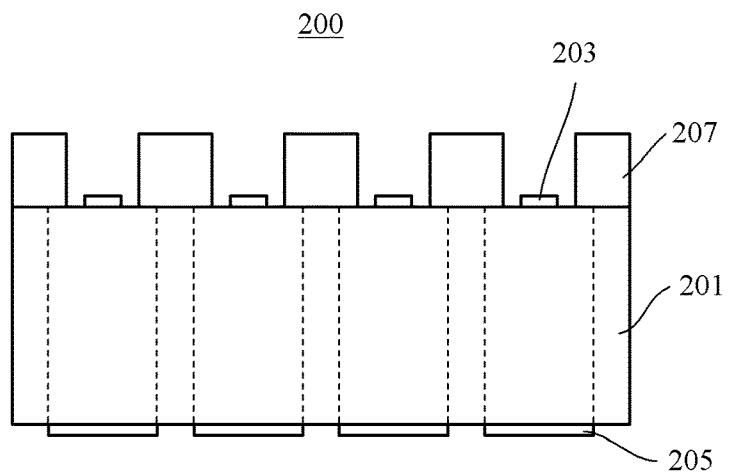
FIG. 2(a) is a cross-sectional view showing an electrode configuration according to an embodiment of the present disclosure.

FIG. 2(a) is a cross-sectional view showing an electrode configuration according to an embodiment of the present disclosure.

As shown in FIG. 2(a), the semiconductor detector 200 according to this embodiment may include a semiconductor detection material 201 and a cathode and an anode provided respectively on opposite sides of the semiconductor detection material 201. Here, the cathode and the anode are formed in a pixel configuration, including pixel cathodes 203 and pixel anodes 205, respectively. These pixel electrodes (cathode or anode) define respective detection pixels of the semiconductor detector. Here, the said "detection pixel" means that the detector performs imaging of the detected radiation based on the detection result of these pixels, that is, the detection pixel corresponds to a pixel in an image of the radiation. Regarding the configuration for the semiconductor detection material, the anode and the cathode, reference may be made to the above description in connection with FIG. 1.

In general, the pixel cathodes 203 and the pixel anodes 205 may correspond to each other one by one. That is, one pixel cathode 203 may correspond to one pixel anode 205, for example, they are aligned with each other in position, and more preferably, their centers are aligned with each other. Thus, the charge caused by the ray incident through one pixel cathode 203 in the semiconductor detection material 201 can be collected by the corresponding pixel anode 205. It should be noted that the pixel cathode 203 and the pixel anode 205 may be the same or different in size and shape.

As described in the Background section, there is a charge sharing problem in a pixel-configured semiconductor detector. For this reason, the semiconductor detector 200 according to this embodiment further includes a barrier electrode 207 provided on a periphery of respective one of the pixel cathodes 203. More specifically, the barrier electrode 207 may be disposed around the pixel cathode 203 to define an aperture facing the pixel cathode 203, through which the incident ray may be incident on the pixel cathode 203. The aperture can be adjusted as desired. For example, the aperture can be enlarged to increase a count rate.

The barrier electrode 207 may be made of a material capable of absorbing or blocking the rays. For example, the barrier electrode 207 may include a metal material with a high atomic number (e.g., not less than the atomic number of iron), such as lead, iron, tungsten, copper, gold, platinum, or indium, or other metallic materials such as aluminum, and so on, or a mixed material thereof or a laminate thereof, such as a stack of lead and copper.

The barrier electrode 207 may have its thickness determined based on the energy of the incident ray so as to be sufficient to absorb or block the incident ray. In addition, the thickness of the barrier electrode 207 may be determined further based on the performance and thickness of the semiconductor detection material 201. For example, it suffices that an un-blocked portion of the incident rays do not affect the normal operation of the detector even if the thickness of the barrier electrode 207 is insufficient to completely block the incident rays.

Figure 2B:
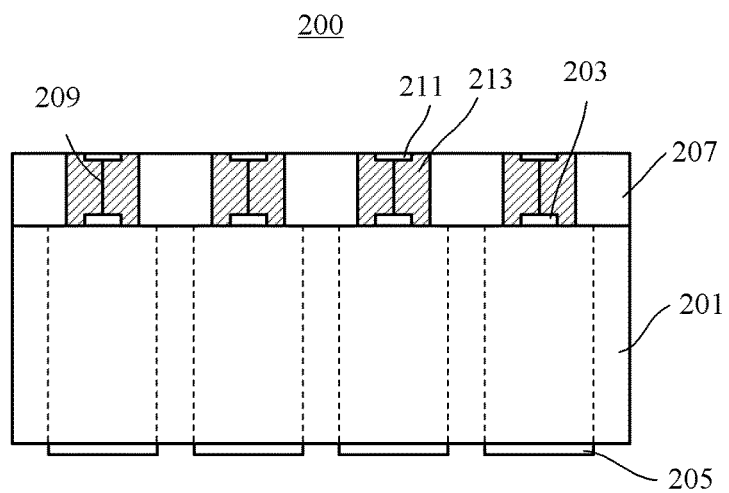
FIG. 2(b) is a cross-sectional view showing an electrode configuration according to an embodiment of the present disclosure.
Figure 2C:
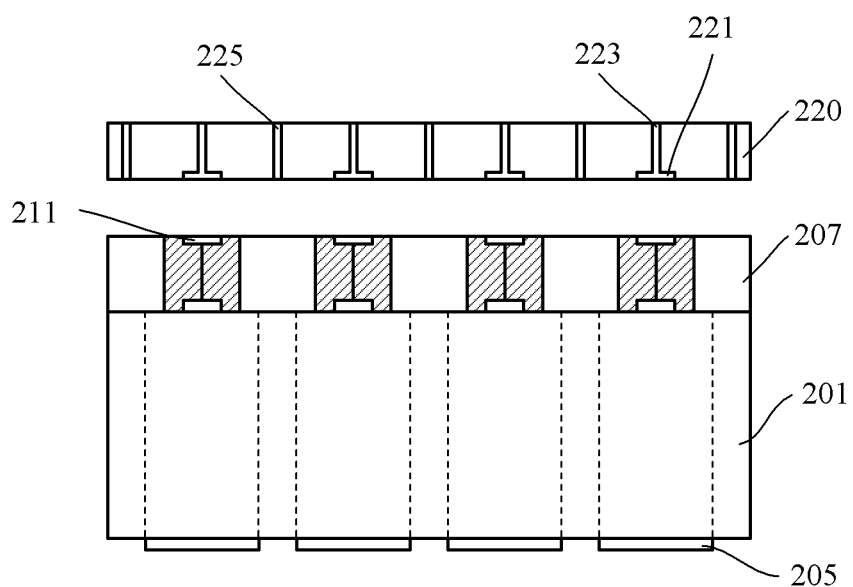
FIG. 2(c) is a cross-sectional view showing a PCB circuit board package according to an embodiment of the present disclosure.

Since edges of the barrier electrode 207 may extend outwardly relative to the boundary of a gap between corresponding pixel anodes 205 (as indicated by the dashed lines in FIG. 2(*a*)), the barrier electrode 207 may be larger than the gap between the corresponding pixel anodes 205 so as to effectively shield the area between the pixel anodes 205. The barrier electrode 207 may be aligned (e.g., center aligned) with the gap between the corresponding pixel anodes 205 according to an embodiment of the present disclosure. Accordingly, the periphery of the pixel cathode 203 may be retracted with respect to the periphery of the corresponding pixel anode 205.

Thus, when the rays are (e.g., vertically) incident on the incident side (the top surface in FIG. 2(*a*)), those incident at intermediate positions between the pixel anodes can be blocked by the barrier electrode 207. In this way, the problem of charge sharing can be suppressed.

The barrier electrode 207 and the pixel cathode 203 may have their sizes determined based on application scenarios, and the size and performance of the semiconductor detection material 201. For example, in applications where pixel accuracy requirement is relatively high, such as medical CTs, small pixel cathodes and barrier electrodes with a relatively large area can be provided; and in applications where pixel accuracy requirement is relatively low, the relative area of the barrier electrode can be reduced.

In FIG. 2(*a*), the case where the barrier electrode 207 is higher than the pixel cathode 203 is shown. However, the present disclosure is not limited thereto. The thickness of the barrier electrode 207 and the thickness of the pixel cathode 203 may be the same. In addition, an insulating material (not shown) may be filled between the barrier electrode 207 and the pixel cathode 203.

As shown in FIG. 2(*b*), when the barrier electrode 207 is higher than the pixel cathode 203, the pixel cathode 203 may be led out to a leading electrode 211 by a wire 209, for example. In addition, the insulating material 213 may be filled between the barrier electrodes 207, and the insulating material 213 may cover the pixel cathodes 203. The leading electrodes 211 may be provided on the insulating material 213. In this way, the leading electrode 211 and the barrier electrode 207 can be in substantially the same plane and facilitate offset connection and package of a PCB board.

For bias voltage setting of the pixel cathode 203 and the barrier electrode 207 during the detection, it can be determined by vertically illuminating the pixel cathode by a reference ray source so that signals entering the pixel cathode 203 are all collected by the corresponding pixel anode 205 at the selected bias voltage. The bias voltages of the pixel cathode 203 and the barrier electrode 207 may be the same or different. The bias voltages can be applied to them through bonding wires. Alternatively, the bias voltages can apply through a PCB board package.

An example PCB circuit board package for the semiconductor detector 200 shown in FIG. 2(*b*) is shown in FIG. 2(*c*). A PCB board 220 may have one side thereof (the lower side in the figure) bonded to one side (the upper side in the figure) of the semiconductor detector 200, as shown in FIG. 2(*c*). Pads 221 may be provided on the side of the PCB circuit board 220 for electrical contact with the leading electrodes 211 of the pixel cathodes. For example, the pattern of the pads 221 may be the same as that of the leading electrodes 211. The pads 221 may be directed through vias 223 to the other side of the PCB board 220 (the upper side in the figure). In addition, vias 225 corresponding to the barrier electrodes 207 are provided in the PCB circuit board 220. The vias 223, 225 may be connected to the bias voltages on the other side of the PCB board (the upper side in the figure).

Figure 3:
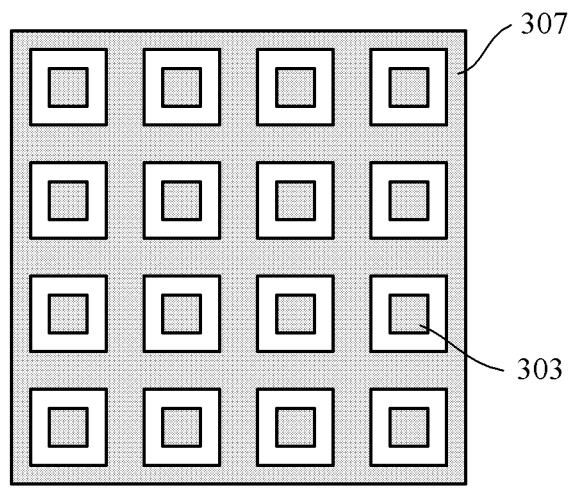
FIG. 3 is a plan view showing an electrode configuration according to an embodiment of the present disclosure.

FIG. 3 is a plan view showing an electrode configuration according to an embodiment of the present disclosure.

The electrode 300 located on the ray incident side according to this embodiment may include a two-dimensional array of pixel cathodes 303. In FIG. 3, a 4×4 array is shown, but the present disclosure is not limited thereto. The present disclosure may include an even larger or smaller array, and the number of pixels in a row need not be equal to the number of pixels in a column in the array. Correspondingly, on the opposite side, pixel anodes may also be formed as a 4×4 array (not shown).

In this example, the pixel cathode 303 is shown as a square, but the present disclosure is not limited thereto. For example, the pixel cathode 303 may be formed into other shapes such as a rectangle, circle, rhombus or other shape, depending on actual needs.

In addition, the electrode 300 further includes a barrier electrode 307. In this example, the barrier electrode 307 is formed as a single sheet across the entire incident side. The single sheet barrier electrode 307 defines a number of apertures therein, and the pixel cathodes 303 are disposed within these apertures. The apertures may be formed as spaces each in a square, rectangular, circular or rhombic shape so that the pixel cathodes 303 in a square, rectangular, circular, or rhombic shape may be provided correspondingly in these apertures. Certainly, the shape of the aperture and the shape of the pixel cathode 303 need not be exactly the same. An insulating material may be provided between the inner wall of the aperture and the periphery of the pixel cathode 303.

In the above embodiments, the array of pixel anodes is shown as a two-dimensional planar array, but the present disclosure is not limited thereto. For example, the array of pixel anodes may be other layouts such as one-dimensional linear array or a trapezoidal structure.

Figure 4:
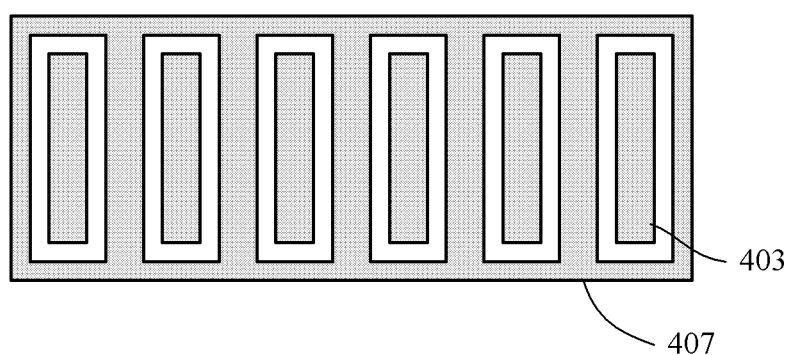
FIG. 4 is a plan view showing an electrode configuration according to another embodiment of the present disclosure.

FIG. 4 is a plan view showing an electrode configuration according to another embodiment of the present disclosure.

As shown in FIG. 4, the electrode 400 according to this embodiment may include a one-dimensional linear array of the pixel cathodes 403 and a barrier electrode 407 provided on a periphery of the pixel cathodes 403. For their configuration, reference can be made to the above description.

The embodiments of the present disclosure have been described above. However, these embodiments are only for illustrative purposes, and are not intended to limit the scope of the present disclosure. The scope of the present disclosure is defined by the appended claims and their equivalents. It will be apparent for those skilled in the art to make various alternatives and modifications without departing from the scope of the present disclosure, and such alternatives and modifications should be within the scope of the present disclosure.

What is claimed is:

1. A semiconductor detector, comprising:
    a semiconductor detection material comprising a first side and a second side opposite to each other, wherein one of the first side and the second side is a ray incident side that receives incident rays;
    a plurality of pixel cathodes disposed on the first side;
    a plurality of pixel anodes disposed on the second side, wherein the pixel anodes and the pixel cathodes correspond to each other one by one;
    a barrier electrode disposed on a periphery of respective one of the pixel cathodes or pixel anodes on the ray incident side, wherein the barrier electrode is made from a material that can substantially block rays incident thereon from entering in the semiconductor detection material; and
    an insulating material filled between the barrier electrode and the pixel cathode or the pixel anode on the ray incident side.

2. The semiconductor detector according to claim 1,
    wherein the ray incident side is the first side, and the barrier electrode is disposed on the periphery of the respective one of the pixel cathodes and is aligned with a gap between corresponding ones of the pixel anodes; or
    wherein the ray incident side is the second side, and the barrier electrode is disposed on the periphery of the respective one of the pixel anodes and is aligned with a gap between corresponding ones of the pixel cathodes.

3. The semiconductor detector according to claim 1, wherein the rays comprises at least one of X-rays, gamma rays, isotope rays, or alpha rays.

4. The semiconductor detector according to claim 1, wherein the pixel anode or the pixel cathode has a square, rectangular, circular or rhombic shape.

5. The semiconductor detector according to claim 1, wherein the barrier electrode defines a space in a square, rectangle, circle or rhombus shape, and the corresponding pixel cathode or pixel anode on the ray incident side is provided in the space.

6. The semiconductor detector according to claim 1, wherein the semiconductor detection material comprises CdZnTe, Ge, CdTe, $HgI_2$, $PbI_2$, TlBr, or GaAs.

7. The semiconductor detector according to claim 1, wherein the pixel anode and the pixel cathode each comprise at least one of gold, platinum, nickel, titanium, or indium.

8. The semiconductor detector according to claim 1, wherein the barrier electrode comprises a metal material with a high atomic number.

9. The semiconductor detector according to claim 8, wherein the barrier electrode comprises at least one of lead, iron, tungsten, copper, gold, platinum, or indium.

10. The semiconductor detector according to claim 1, wherein the pixel anodes or the pixel cathodes are arranged in a one-dimensional linear array or a two-dimensional planar array.

11. The semiconductor detector according to claim 1, wherein the barrier electrode has a top surface at a higher level than that of the pixel cathodes or pixel anodes on the ray incident side.

12. The semiconductor detector according to claim 11, further comprising:
    an insulating material filled in gaps between the respective barrier electrodes to enclose the pixel cathodes or pixel anodes on the ray incident side, wherein the insulating material has a top surface at substantially the same level as the top surface of the barrier electrode;
    leading electrodes disposed on the insulating material corresponding to the respective ones of the pixel cathodes or pixel anodes on the ray incident side; and
    wires disposed in the insulating material to electrically connect the respective ones of the pixel cathodes or pixel anodes on the ray incident side to the respective leading electrodes.

* * * * *